United States Patent
Kanno et al.

(10) Patent No.: US 7,473,612 B2
(45) Date of Patent: Jan. 6, 2009

(54) METHOD FOR FABRICATING A VARIABLE-RESISTANCE ELEMENT INCLUDING HEATING A $RMCOO_3$ PEROVSKITE STRUCTURE IN AN OXYGEN ATMOSPHERE

(75) Inventors: Tsutomu Kanno, Osaka (JP); Akihiro Odagawa, Osaka (JP); Yasunari Sugita, Osaka (JP); Akihiro Sakai, Osaka (JP); Hideaki Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 96 days.

(21) Appl. No.: 11/417,200

(22) Filed: May 4, 2006

(65) Prior Publication Data

US 2006/0273877 A1 Dec. 7, 2006

Related U.S. Application Data

(63) Continuation of application No. PCT/JP2005/016913, filed on Sep. 14, 2005.

(30) Foreign Application Priority Data

Sep. 14, 2004 (JP) .............................. 2004-266381

(51) Int. Cl.
  *H01L 21/20* (2006.01)
(52) U.S. Cl. ............... 438/385; 257/295; 257/E27.004; 365/158
(58) Field of Classification Search ............... 438/385; 257/295; 365/158
See application file for complete search history.

(56) References Cited

U.S. PATENT DOCUMENTS

| 6,204,139 | B1 | 3/2001 | Liu et al. |
| 7,326,979 | B2 * | 2/2008 | Rinerson et al. ............. 257/295 |
| 2004/0114428 | A1 | 6/2004 | Morikawa |

(Continued)

FOREIGN PATENT DOCUMENTS

JP 7-263646 A 10/1995

(Continued)

OTHER PUBLICATIONS

Nagaev, E., "Colossal-magnetoresistance materials: manganites and conventional ferromagnetic semiconductors" Physics Reports 346 (2001) 387-531.

(Continued)

*Primary Examiner*—Dung A. Le
(74) *Attorney, Agent, or Firm*—McDermott Will & Emery LLP

(57) ABSTRACT

A method for fabricating a variable-resistance element, the resistance of a material layer being variable in accordance with an electric current or voltage applied across first and second electrodes, the method including: (1) a first electrode production step; (2) a step of forming the material layer on the first electrode, wherein the material layer comprises an oxide semiconductor having a perovskite structure represented by the chemical formula $RMCoO_3$, wherein R is a rare-earth element and M is an alkaline-earth element; (3) an oxygen treatment step of heating the material layer in an oxygen atmosphere; (4) a step of forming the second electrode on the material layer that was subjected to the oxygen treatment step; and (5) a hydrogen treatment step of heating the material layer in a reducing atmosphere containing hydrogen.

6 Claims, 10 Drawing Sheets

U.S. PATENT DOCUMENTS

2004/0114429 A1   6/2004   Ehiro et al.
2004/0159828 A1   8/2004   Rinerson et al.

FOREIGN PATENT DOCUMENTS

| JP | 2003-068983 | 3/2003 |
| JP | 2004-185756 A | 7/2004 |
| JP | 2004-186553 A | 7/2004 |

OTHER PUBLICATIONS

Chinese Office Action, with English Translation, issued in Chinese Patent Application No. CN 200580003381.8, dated May 9, 2008.

Proceedings of the NATO Advanced Study Institute on New Trends in Intercalation Compounds for Energy Storage, 2002.

* cited by examiner

METHOD FOR FABRICATING A VARIABLE-RESISTANCE ELEMENT INCLUDING HEATING A RMCOO₃ PEROVSKITE STRUCTURE IN AN OXYGEN ATMOSPHERE

RELATED APPLICATIONS

This application is a continuation of International application Ser. No. PCT/JP2005/016913, filed on Sep. 14, 2005, which in turn claims the benefit of Japanese Application No. 2004-266381, filed on Sep. 14, 2004, the disclosures of which Applications are incorporated by reference herein.

TECHNICAL FIELD

The present invention relates to a variable-resistance element and a non-volatile memory using the same.

BACKGROUND OF THE INVENTION

Currently, memories are employed in various functional fields as key electronic components supporting an information society.

In conventional memories, SRAM, DRAM and FLASH are mainstream memories in which switching is performed in accordance with a change in charge capacity C. Moreover, various logic circuits, complicated memories, etc., are fabricated by combining such memories.

In recent years, there has been an increased demand for miniaturized and less expensive functional elements such as memories due to the spread of information terminals and the reduced cost of electronic components. In the field of non-volatile memories for information terminals, numerous memories which respond to the demand for miniaturization and cost reduction have been proposed by employing new techniques.

However, memories miniaturized to a nanoscale level are unsatisfactory in terms of charge capacity C. Therefore, in memories using a change in charge capacity C, there is a limit to the achievement of further miniaturization and high performance at the same time.

Recently, people have come to hold great expectations for techniques in which a variation of not charge capacity C but electric resistance R is utilized in switches or memories. Because electric resistance R is not restricted by charge capacity, there is no limit to memory miniaturization. Examples of functional elements using a variation of electric resistance R include variable-resistance elements in which an oxide represented by the chemical formula $PrCaMnO_3$ (hereunder sometimes referred to as "PCMO") is used, as disclosed in Patent Documents 1 and 2.

[Patent Document 1] U.S. Pat. No. 6,204,139
[Patent Document 2] Japanese Unexamined Patent Publication No. 2003-068983
[Non-patent Document 1] Physics Reports Vol. 346 (2001) pp. 387-531

DISCLOSURE OF THE INVENTION

[Problem to be Solved by the Invention]
However, variable-resistance elements using an oxide represented by PCMO are susceptible to improvement in terms of the operation stability and reproducibility.

For example, in order to reduce leak current, heat treatment may be conducted in a hydrogen atmosphere (i.e., in a reducing atmosphere) during the fabrication process of such variable-resistance elements in the same manner as fabrication processes for common semiconductors; however, desorption of oxygen is observed when PCMO is subjected to a heat treatment in a reducing atmosphere. As a result, the electric conduction mechanism of the oxide changes and the capacity for resistance variation as disclosed in Patent Document 1 is impeded. In the worst case, this may stop occurrence of resistance variation.

The present invention has been accomplished in view of the above problems. One of the main objects of the present invention is to provide a variable-resistance element in which deterioration in its capacity for resistance variation is suppressed, even when heat treatment is conducted in a reducing atmosphere.

[Means for Solving the Problem]
The present inventors conducted extensive research in light of problems of the prior art techniques, and found that the above object can be achieved by combining a specific oxide and a specific treatment. The present invention was completed based on this finding.

In other words, the present invention relates to variable-resistance elements and methods for fabricating the same, and non-volatile memories using such variable-resistance elements as described below.

1. A method for fabricating a variable-resistance element provided with a material layer and first and second electrodes electrically connected to the material layer, the resistance of the material layer being variable in accordance with an electric current or voltage applied across the first and second electrodes, the method comprising:

(1) a first electrode production step;

(2) a step of forming the material layer on the first electrode, wherein the material layer comprises an oxide semiconductor having a perovskite structure represented by the chemical formula $RMCoO_3$, wherein R is a rare-earth element and M is an alkaline-earth element;

(3) an oxygen treatment step of heating the material layer in an oxygen atmosphere; and (4) a step of forming the second electrode on the material layer that was subjected to the oxygen treatment step.

2. A fabrication method according to Item 1, wherein the oxide semiconductor having a perovskite structure is represented by the chemical composition formula $Pr_{1-x}Ca_xCoO_3$, wherein $0.4 \leq x \leq 0.6$.

3. A fabrication method according to Item 1, wherein the step of forming the material layer and the oxygen treatment step are repeated.

4. A fabrication method according to Item 1, wherein the oxygen treatment step is a step of heating the material layer in an atmosphere containing at least one member selected from the group consisting of molecular oxygen ($O_2$), ozone ($O_3$), and atomic oxygen (O).

5. A fabrication method according to Item 1, wherein the oxygen treatment step is a step of heating the material layer at 100 to 800° C.

6. A fabrication method according to Item 1, wherein the oxygen treatment step is a step of heating the material layer for 30 minutes to 12 hours.

7. A variable-resistance element provided with a material layer comprising an oxide semiconductor having a perovskite structure represented by the chemical formula $RMCoO_3$ (wherein R is a rare-earth element and M is an alkaline-earth element) and first and second electrodes electrically connecting to the material layer, the resistance of the material layer being variable in accordance with an electric current or voltage applied across the first and second electrodes.

8. A variable-resistance element according to Item 7, wherein the oxide semiconductor having a perovskite structure is represented by the chemical composition formula $Pr_{1-x}Ca_xCoO_3$, wherein $0.4 \leq x \leq 0.6$.

9. A variable-resistance element according to Item 7, wherein an electric current or voltage is applied in pulses.

10. A non-volatile memory comprising a transistor and the variable-resistance element of Item 7, the transistor and the variable-resistance element being electrically connected.

[Effect of the Invention]

In the variable-resistance element of the present invention, the material layer comprises an oxide semiconductor having a perovskite structure represented by $RMCoO_3$, wherein R is a rare-earth element and M is an alkaline-earth element.

The material layer exhibits the same or better resistance law (resistance taper) than conventional material layers by subjecting the material layer to heat treatment in an oxygen atmosphere (hereunder sometimes referred to as an oxygen treatment). Having been subjected to the oxygen treatment, the material layer shows less deterioration in its capacity for resistance variation even when the heat treatment in a reducing atmosphere is conducted in a later step.

The variable-resistance element of the present invention is applicable to a non-volatile memory. For example, by combining the variable-resistance element of the present invention with a transistor, a non-volatile memory can be obtained. The variable-resistance element of the present invention can also be suitably used as a logic circuit, and as a sensor for detecting light, heat, stress, magnetism, etc. Furthermore, the variable-resistance element of the present invention can be used in electronic equipment having a random access memory function, such as an image display device.

Figure 1:
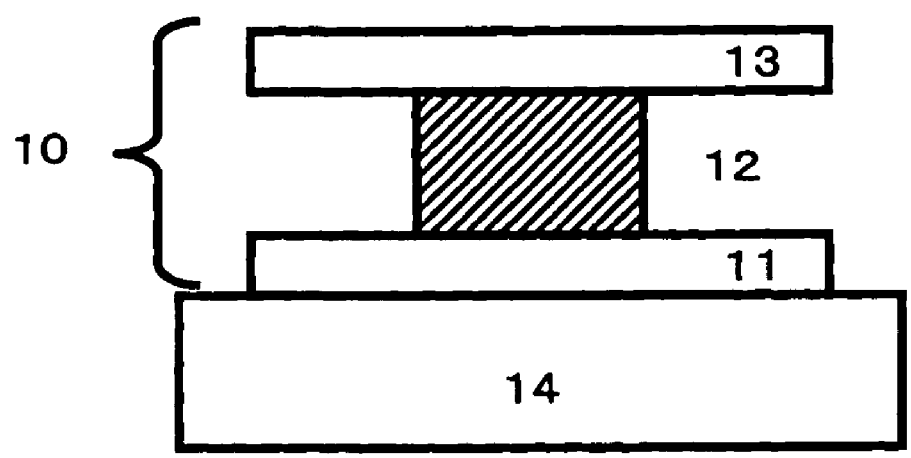
FIG. 1 is a schematic diagram showing the structure of a variable-resistance element.

EXPLANATION OF NUMERICAL SYMBOLS 10 variable-resistance element
11 first electrode (lower electrode)
12 material layer
13 second electrode (upper electrode)
14 substrate
20 memory element
21 transistor
30 arrayed memory elements
31 word line
33 bit line
51 reference resistance
61 contact electrode
62 drain electrode
63 source electrode
64 gate oxidized layer
65 gate electrode
66 insulated oxide film
71 contact hole
72 electric conductor
91 extraction electrode
92 interlayer insulating layer

BEST MODE FOR CARRYING OUT THE INVENTION

The variable-resistance element of the present invention and a non-volatile memory using the same are explained below.

1. Variable-resistance Element

The variable-resistance element of the present invention is provided with a material layer that comprises an oxide semiconductor having a perovskite structure represented by the chemical formula $RMCoO_3$ (wherein R is a rare-earth element and M is an alkaline-earth element) and first and second electrodes electrically connected to the material layer. The resistance of the material layer is changed in accordance with an electric current or voltage applied across the first and second electrodes.

The material layer comprises an oxide semiconductor having a perovskite structure represented by the chemical formula $RMCoO_3$, wherein R is a rare-earth element and M is an alkaline-earth element (this is also the same in the following formulae).

The material layer (oxide semiconductor) represented by the above-mentioned chemical formula does not exhibit the resistance law merely by employing a thin-film formation technique; however, the material layer exhibits the same or better resistance law than a material layer using conventional PCMO when subjected to an oxygen treatment, i.e., heated in an oxygen atmosphere. Furthermore, a material layer having been subjected to an oxygen treatment shows less deterioration in its capacity for resistance variation even when the heat treatment in a reducing atmosphere is conducted in a later step. In other words, the resistance law attained by the oxygen treatment is stably maintained regardless of the nonstoichiometry of $RMCoO_3$, and therefore the resistance law is stably maintained even when oxygen desorption occurs due to a heat treatment conducted in a reducing atmosphere.

There is no limitation to R as long as it is a rare-earth element; however, Pr is preferable. There is no limitation to M as long as it is an alkaline-earth element; however, Ca is preferable. In other words, a compound represented by the chemical formula $PrCaCoO_3$ is preferable as an oxide semiconductor having a perovskite structure. More specifically, an oxide semiconductor represented by the chemical composition formula $Pr_{1-x}Ca_xCoO_3$ (wherein $0.4 \leq x \leq 0.6$) is preferable because its resistance law is hardly deteriorated even when it is subjected to a heat treatment in a hydrogen or other reducing atmosphere.

Note that each of the R and M elements of an oxide semiconductor having a perovskite structure is not limited to one kind. For example, when Ca is used as an alkaline-earth element, some of the Ca may be replaced with Sr, Ba, etc. A combination of such elements can be suitably selected depending on the desired properties of the variable-resistance element, i.e., the final product.

A first electrode and a second electrode are each connected to the material layer. The resistance of the material layer changes in accordance with an electric current or voltage applied across the first and second electrodes. In an embodiment in which the first electrode and the second electrode are each connected to the material layer, the material layer is sandwiched between the electrodes. In such a case, the first electrode is layered on one surface of the material layer and the second electrode is layered on the other surface of the material layer. Here, the first electrode (sometimes referred to as a lower electrode) is an electrode on which a material layer can be formed. In other words, when the variable-resistance element of the present invention is formed by laminating electrodes and a material layer, the material layer is formed on the first electrode (lower electrode), and the second electrode (sometimes referred to as an upper electrode) is then formed on the material layer. Note that the variable-resistance element may be formed on a substrate 14 as shown in FIG. 1. One example of the substrate is an Si(100) substrate having a thermally oxidized film on the surface thereof.

An electrode on which a material layer can be formed is used as a first electrode. Examples of the materials for the first electrode include platinum (Pt), iridium (Ir), and oxides thereof. Use of such materials is preferable because the crystal structure of the first electrode can be maintained stably even when the material layer is exposed to a hot oxygen atmosphere during the oxygen treatment step. Examples of other useful materials include conductive oxides such as $SrTiO_3$ and $SrRuO_3$ partially containing Nb, Cr, La, etc. Such materials are preferable because a material layer can be epitaxially grown thereon. The first electrode may be a single layer or a multilayer of the above-mentioned materials. For example, when a first electrode (Pt) is formed on an Si substrate having a thermally oxidized film ($SiO_2$) on the surface thereof, adherence between the first electrode and the substrate may be unsatisfactory; however, the adherence can be enhanced by forming the first electrode as a multilayer of Pt and Ti and adhering Ti to $SiO_2$.

There is no limitation to the second electrode as long as it is formed of an electrically conductive material. Examples of the materials for the second electrode include gold (Au), platinum (Pt), ruthenium (Ru), iridium (Ir), iridium-tantalum (Ir—Ta), titanium (Ti), aluminum (Al), copper (Cu), tantalum (Ta), and indium tin oxide (ITO). These materials are preferable because they have a low resistivity and can reduce the power consumption of the variable-resistance element. Similar to the first electrode, the second electrode may be a single layer of one of the above-mentioned materials or a multilayer combining a plurality of the materials.

There is no limitation to the thickness of the material layer, the first electrode, and the second electrode. The thickness of the material layer is preferably about 50 to 1000 nm. The thickness of the first electrode is preferably about 50 to 1000 nm. The thickness of the second electrode is preferably about 50 to 1000 nm.

In the variable-resistance element of the present invention, the resistance of the material layer is changed in accordance with an electric current or voltage applied across the first and second electrodes, and the changed resistance is maintained. There is no limitation to the mode of applying an electric current or voltage; however, application of an electric current or voltage having a pulsed pattern is preferable for reducing power consumption and increasing the speed of the variable-resistance element. In this structure, by controlling the polarity and intensity of the pulse, the resistance of the material layer can be easily controlled. Hereunder, a voltage having a pulsed waveform is sometimes referred to as pulsed voltage and an electric current having a pulsed waveform is sometimes referred to as pulsed electric current.

The variable-resistance element of the present invention is applicable to a non-volatile memory (memory element) because of the above-described properties. For example, by electrically connecting the variable-resistance element to a transistor, the variable-resistance element can serve as a non-volatile memory.

A variable-resistance element of the present invention and a non-volatile memory using the same are concretely explained below with reference to drawings.

The variable-resistance element shown in FIG. 1 comprises a material layer 12 formed of an oxide semiconductor having a perovskite structure represented by the chemical formula $RMCoO_3$, a first electrode (lower electrode) 11, a second electrode (upper electrode) 13, and a substrate 14.

In the structure shown in FIG. 1, when an electric current or voltage is applied across the second electrode 13 and the first electrode 11, the resistance of the material layer 12 is changed, and the resistance is maintained at the changed level.

It is preferable to apply a pulsed electric current or voltage. Application of such an electric current or voltage can reduce power consumption during writing, deleting, or reading the data of the variable-resistance element, and accelerate the change of resistance. In addition, application of a pulsed electric current or voltage is also preferable for reducing the loss of Joule heat and improving the efficiency of the device.

In the structure of FIG. 1, the resistance of the material layer 12 can be changed from high to low by applying a pulsed voltage or electric current to the first electrode 11 with the second electrode 13 being set at a positive bias. In contrast, by applying a voltage or electric current having a reverse polarity, the resistance of the material layer 12 can be changed from low to high. Note that when the electric potential of the first electrode 11 is 0, if the sign of the electric potential of the second electrode 13 is positive, it is defined as a positive bias, and if the sign of the electric potential thereof is negative, it is defined as a negative bias.

Figure 2:
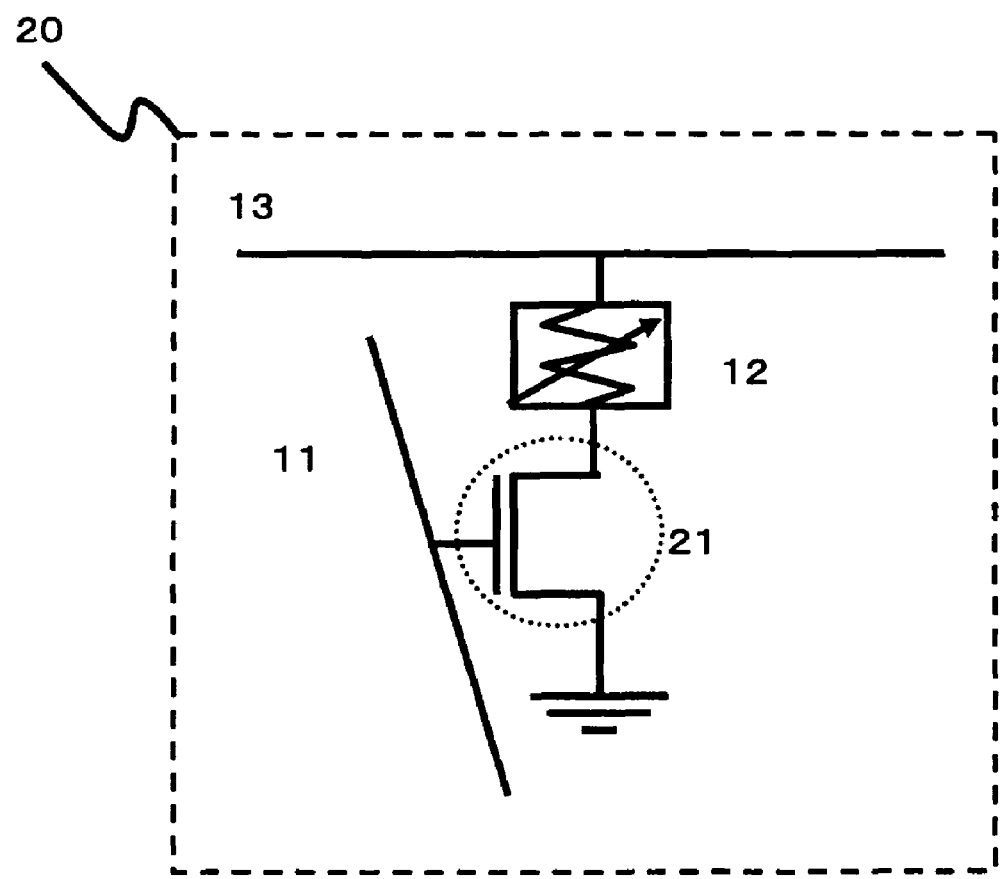
FIG. 2 is a diagram showing the concept of a structure of a memory element.

The variable-resistance element of the present invention is applicable to a non-volatile memory (memory element). A non-volatile memory can be fabricated by electrically connecting a variable-resistance element to a transistor. For example, as shown in FIG. 2, by electrically connecting a transistor (switching element) 21 to a variable-resistance element, a memory element 20 can be obtained. The memory element 20 may be used singly, or a plurality of memory elements 20 may be used in a combined manner. For example, the memory elements 20 may be arranged in a matrix (see FIG. 3).

Figure 3:
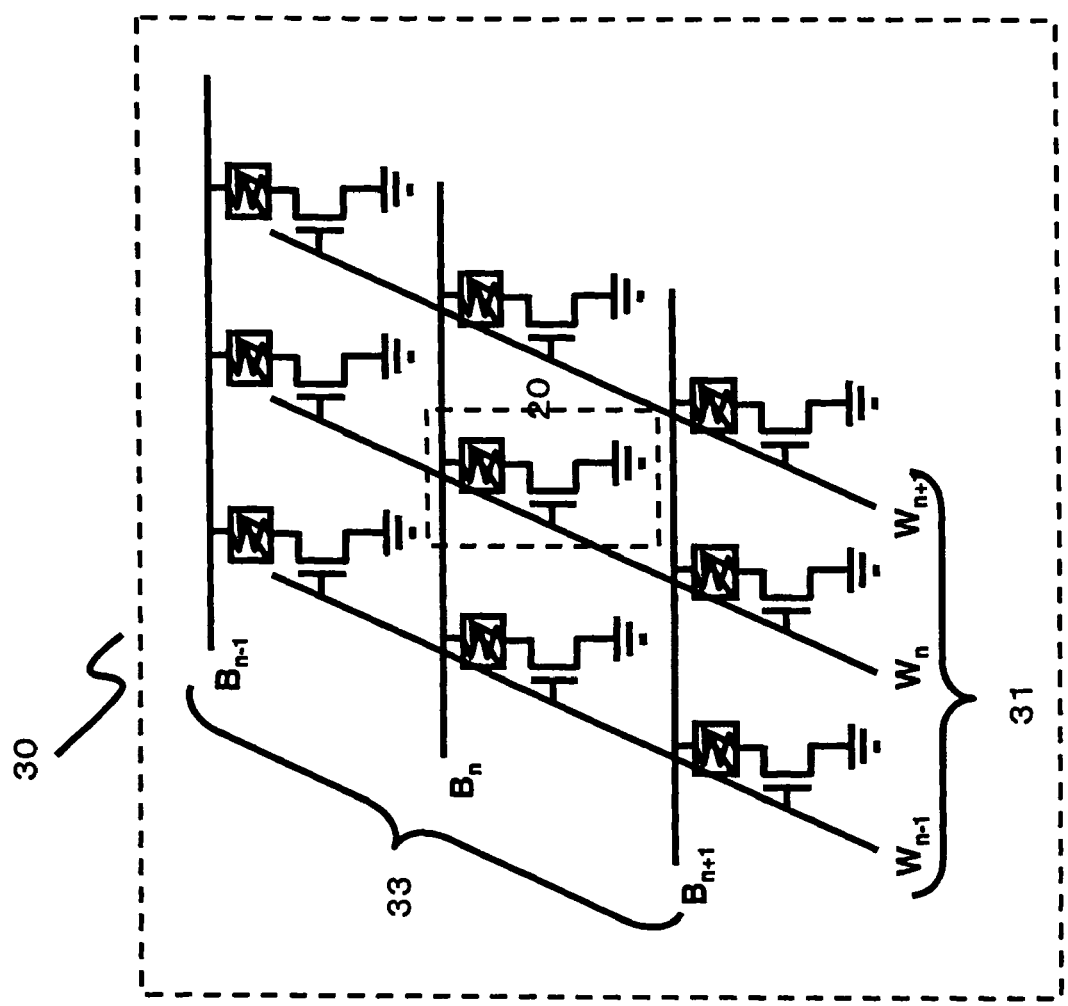
FIG. 3 is a diagram showing the structure of arrayed memory elements.

By arranging the memory elements 20 in an array as shown in FIG. 3, a random access-type non-volatile memory can be obtained. In FIG. 3, by selecting Bn from bit lines 33 and Wn from word lines 31, writing or reading the memory element (Bn, Wn) can be conducted.

Figure 4:
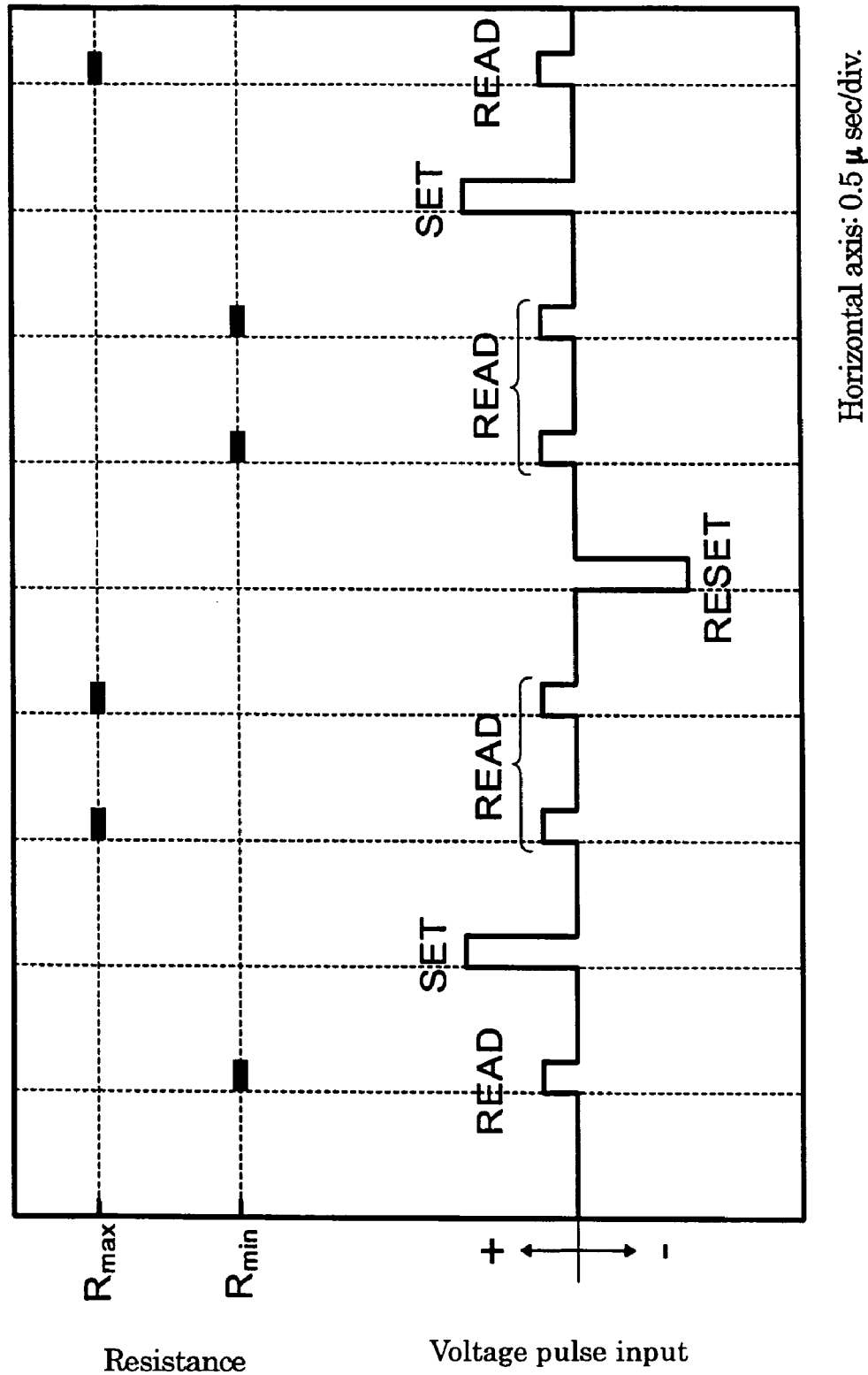
FIG. 4 shows the memory operation of a memory element.
Figure 5:
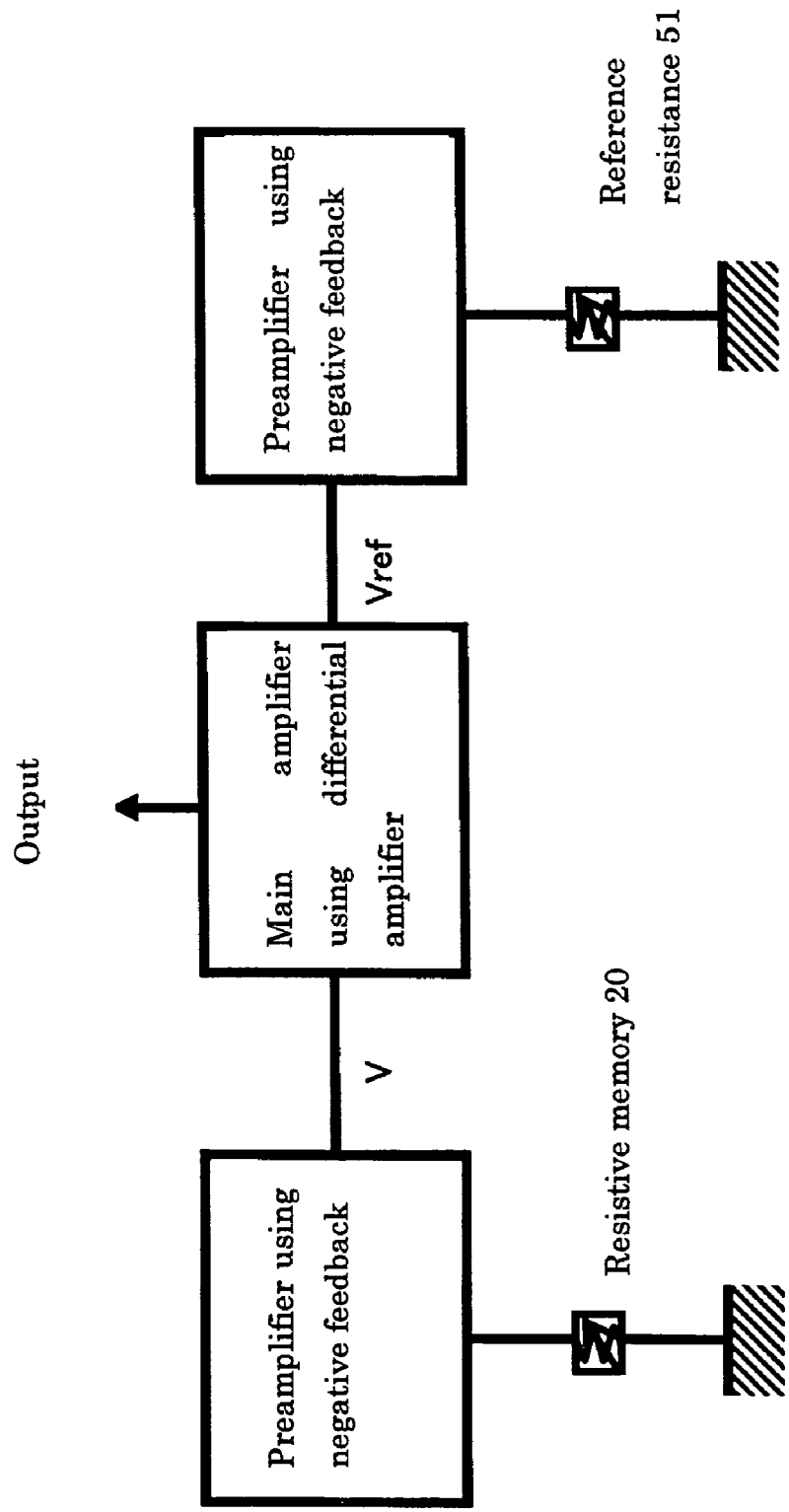
FIG. 5 is a diagram explaining the output detection operation of a variable-resistance element.

Writing or reading the memory element can be performed by varying the intensity of the pulse bias applied. As shown in FIG. 4, positive bias is defined as SET (writing) and negative bias is defined as RESET (deleting). During READ (reading), the change in the electric current generated by applying a satisfactorily small voltage, i.e., about $\frac{1}{1000}$ to $\frac{1}{4}$ of the voltage for SET and/or RESET, is detected. It is preferable that detection of finite differences be conducted using a reference resistance 51 as shown in FIG. 5 so as not to be affected by the variation in the absolute value of resistance. Note that when a material layer is formed on a wide substrate, the resistance may vary depending on the region of the substrate. Therefore, it is preferable to use an adjacent memory element as a reference resistance when reading data, and to conduct the detection of finite differences.

2. A Method for Fabricating a Variable-resistance Element

A variable-resistance element of the present invention can be fabricated by a fabrication method comprising:

(1) a first electrode production step;

(2) a step of forming the material layer on the first electrode, wherein the material layer comprises an oxide semiconductor having a perovskite structure represented by the chemical formula $RMCoO_3$, wherein R is a rare-earth element and M is an alkaline-earth element;

(3) an oxygen treatment step of heating the material layer in an oxygen atmosphere; and (4) a step of forming the second electrode on the material layer that was subjected to the oxygen treatment step.

Figure 6:
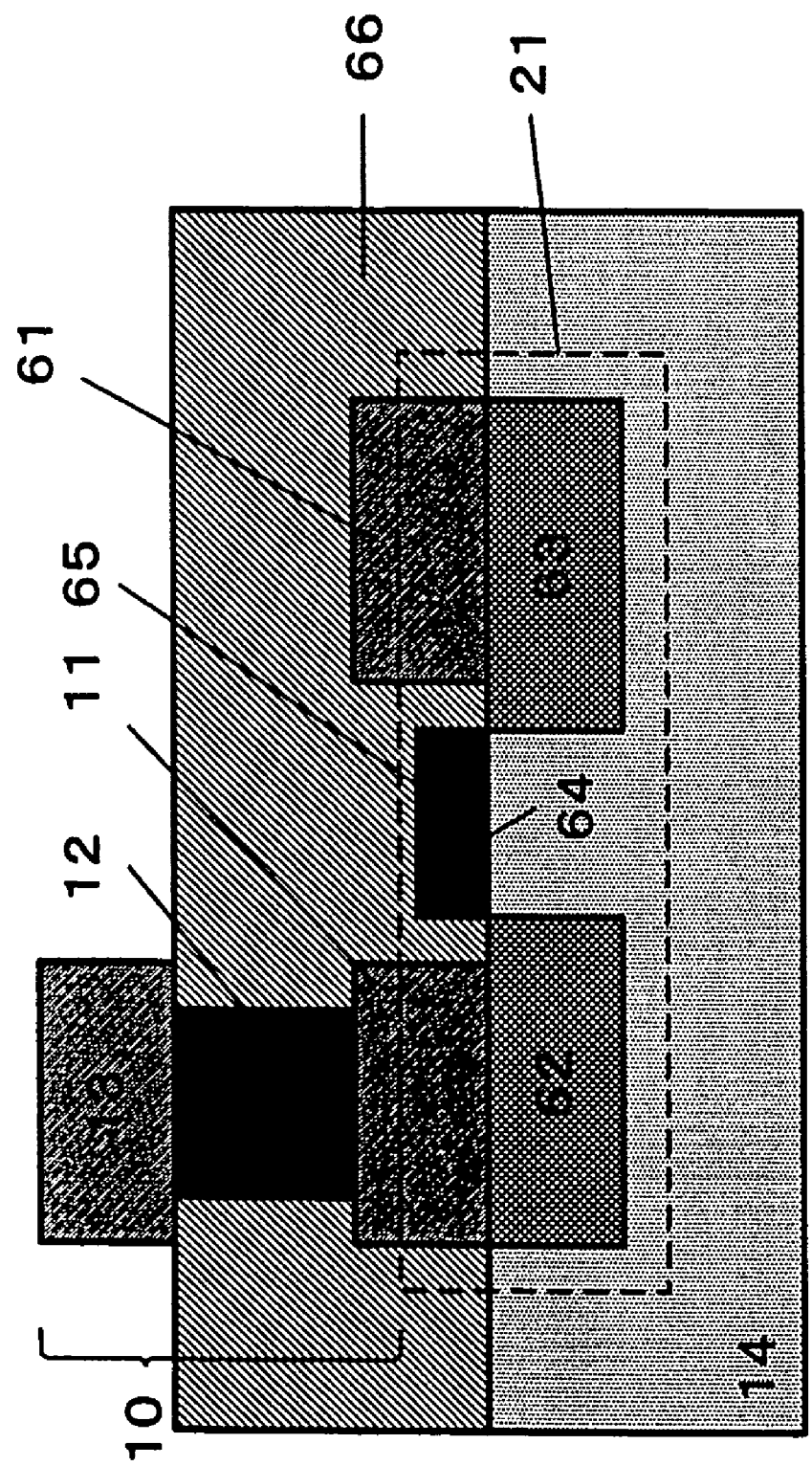
FIG. 6 is a diagram schematically showing the structure of a memory element.
Figure 7:
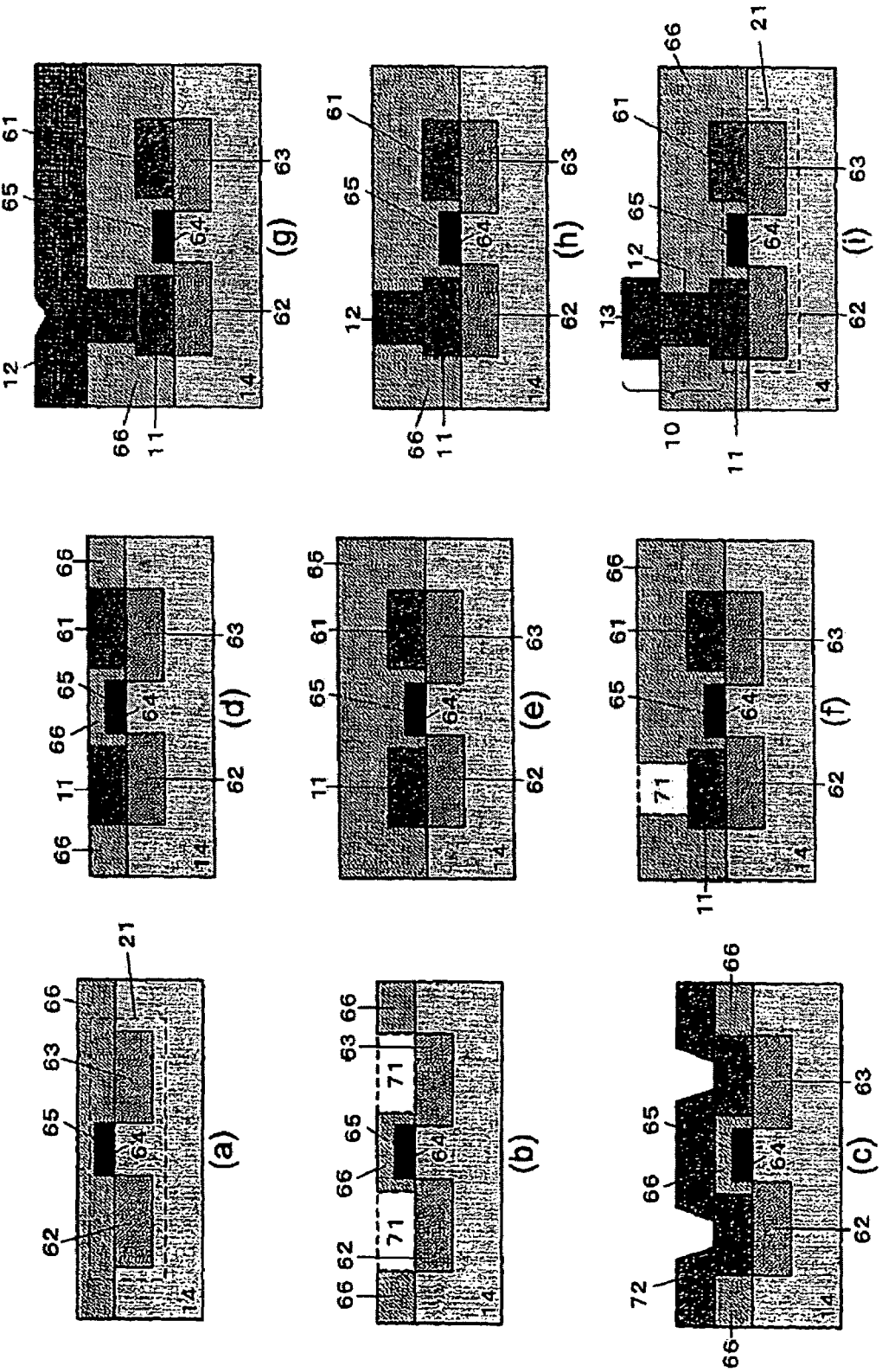
FIG. 7 shows steps of fabricating a memory element.

A method for fabricating a variable-resistance element is explained below by explaining a method for fabricating the above-described single memory element. Specifically, a process for fabricating a variable resistance element 10 on a substrate 14 provided with a transistor 21 as shown in FIG. 6 is explained. FIG. 7 shows the fabrication process.

(1) First Electrode Formation Step

First, as shown in FIG. 7(*a*), an insulated oxide film 66 formed of $SiO_2$, etc., is deposited on a substrate 14 provided with a transistor 21. As shown in FIG. 7(*i*), the insulated oxide film 66 separates the upper and lower electrodes (the lower and upper wiring of a memory element) and functions as an interlayer insulating layer, and therefore it is preferable that the insulated oxide film 66 be composed of insulating materials such as $SiO_2$, $Al_2O_3$, etc., or a laminate thereof.

The insulated oxide film 66 can be formed by standard thin-film formation techniques. Examples of such thin-film formation techniques include pulsed laser deposition (PLD); ion beam deposition (IBD); ionized cluster beam; RF, DC, ECR, helicon, ICP, facing target and like sputtering techniques; MBE, ion plating and like PVD (physical vapor deposition) techniques; CVD (chemical vapor deposition) techniques; MOCVD (metal organic chemical vapor deposition) techniques; plating; MOD (metallorganic decomposition); sol gel method; etc. Note that such thin-film formation techniques can also be employed for forming a first electrode 11 (lower electrode), a contact electrode 61, a material layer 12 and a second electrode 13 (upper electrode).

Next, a contact hole 71 is formed in the insulated oxide film 66 as shown in FIG. 7(*b*). The contact hole 71 can be formed by standard micromachining techniques. Examples of such micromachining techniques include micromachining employed in the fabrication of semiconductors; and micromachining techniques employed in fabricating magnetic devices, such as GMR, TMR magnetic heads, MRAM (magnetoresistive random access memory) and the like. Specific examples include ion milling, RIE (reactive ion etching), FIB (focused ion beam) and like physical or chemical etching techniques. In order to form a fine pattern, it is also possible to combine a plurality of photolithography techniques in which a stepper, EB (electron beam), or the like is employed. Such micromachining techniques can also be employed for forming other layers.

Subsequently, an electric conductor 72 is deposited (FIG. 7(*c*)) on the insulated oxide film 66.

An embedded-type first electrode 11 and contact electrode 61 as shown in FIG. 7(*d*) are then obtained by flattening the surface of the electric conductor 72. The flattening treatment can be conducted by CMP (chemical mechanical polishing), ionized cluster beam etching, etc.

(2) Material Layer Formation Step

After depositing the insulated oxide film 66 on the first electrode 11 and contact electrode 61 (FIG. 7(*e*)), a contact hole 71 is formed (FIG. 7(*f*)).

An oxide having a perovskite structure represented by $RMCoO_3$ is then deposited thereon, and an embedded-type material layer 12 is formed by flattening the surface (FIGS. 7(*g*) and 7(*h*)).

(3) Oxygen Treatment Step

The material layer 12 embedded in the contact hole 71 exhibits the resistance law by being subjected to an oxygen treatment. The resistance law of the material layer 12 that has been subjected to an oxygen treatment is satisfactorily maintained even when the material layer 12 undergoes heat treatment in a reducing atmosphere in a later step.

In the oxygen treatment step, the material layer 12 is heated in an oxygen atmosphere (an atmosphere comprising at least one member selected from the group consisting of molecular oxygen ($O_2$), ozone ($O_3$), and atomic oxygen (O)).

The heating temperature is not limited as long as oxygen can actively react to the material layer 12. For example, in the case of a molecular oxygen-containing atmosphere, the temperature is preferably in the range of about 400 to 800° C. When an atmosphere comprising ozone or atomic oxygen is used, the temperature is preferably in the range of about 100 to 800° C. In other words, the heating temperature can be suitably selected in the range of 100 to 800° C. depending on the type of atmosphere.

The heating time can be suitably selected depending on the heating temperature. A typical heating time is 30 minutes to 12 hours. When the heating temperature is low, the heating time is usually longer.

The oxygen treatment step can be applied not only to the material layer 12 after formation but also to a material layer during formation. Depending on the thickness, type, etc., of the material layer 12, the diffusion of oxygen may be difficult by only applying an oxygen treatment to the material layer after formation. By including an oxygen treatment step in the material layer formation step, oxygen can be satisfactorily diffused in the entire material layer. In this case, by repeating the material layer formation step and the oxygen treatment step, a material layer 12 that was subjected to an oxygen treatment can be obtained as a result.

(4) Second Electrode Formation Step

As the last step, a second electrode 13 (upper electrode) is provided as shown in FIG. 7(*i*). Also in this step, the second electrode 13 is formed by combining a thin-film formation step, micromachining, flattening treatment, etc.

A memory element is thus obtained by conducting the above-described steps.

EXAMPLES

The present invention is explained in detail below with reference to Examples and Comparative Examples.

Example 1 (Sample Numbers 1-1 to 1-9) and Comparative Examples 1-3

<Fabrication of the Variable-resistance Element>

A variable-resistance element as shown in FIG. 1 was fabricated by a magnetron sputtering method. 200 nm of Pt was used for a first electrode 11, 600 nm of $Pr_{1-x}Ca_xCoO_3$ (hereafter referred to as PCCO in Example 1) was used for a material layer 12, and 1000 nm of Ag was used for a second electrode 13. An Si (100) substrate having a thermally oxidized film on the surface thereof was used as a substrate 14.

Conditions for the magnetron sputtering in the formation of the first electrode 11 (Pt) and the second electrode 13 (Ag) are as follows:
   substrate temperature: room temperature
   gas-pressure at the time of growth (deposition): 1 Pa
   atmosphere: only argon
   input electric power: 80 W Conditions for the magnetron sputtering in the formation of the material layer 12 (PCCO) are as follows:
   substrate temperature: 650° C.
   gas-pressure at the time of growth (deposition): 3 Pa
   atmosphere: mixture of oxygen and argon (the oxyecoia partial pressure was 20% of the total pressure)
   input electric power: 100 W After growing (depositing) the material layer to 300 nm, growth was halted and an oxygen treatment was conducted. The oxygen treatment was such that the material layer was placed in a pure oxygen atmosphere of 50 Pa at 500° C. for 5 hours.

After conducting the oxygen treatment, the substrate temperature was raised to 650° C., and 300 nm of PCCO was further deposited thereon.

After the deposition, the oxygen treatment as described above was conducted again while cooling the substrate to room temperature. In other words, in Example 1, the material layer formation step and the oxygen treatment step were conducted two times each.

In Example 1, by varying x, i.e., by varying the ratio of chemical constituents of PCCO, nine types of variable-resistance elements were obtained. In other words, in the range of $0.1 \leq x \leq 0.9$, nine types of material layers were formed with intervals of 0.1. Each of the nine types of material layers were given sample numbers of 1-1 to 1-9 (see Table 1).

As Comparative Example 1 (Conventional Example A), a variable-resistance element (x=0.5) was fabricated without conducting an oxygen treatment. In Comparative Example 1, a variable-resistance element was fabricated by the same method as that in Example 1 except that an oxygen treatment was not conducted.

As Comparative Example 2 (Conventional Example B), a variable-resistance element was fabricated using $Pr_{0.7}Ca_{0.3}MnO_3$ (referred to as PCMO in Comparative Example 2) as the material layer 12.

The method for fabricating the variable-resistance element of Comparative Example 2 is as below.

An Si (100) substrate having a thermally oxidized film on the surface thereof was used as a substrate 14.

The materials and formation methods of the first electrode 11 and the second electrode 13 were the same as those in Example 1.

The conditions of the magnetron sputtering for forming the material layer 12 (PCMO) are as follows:
   substrate temperature: 700° C.
   gas-pressure at the time of growth (deposition): 3 Pa
   atmosphere: a mixture of oxygen and argon (the oxyecoia partial pressure was 20% of total pressure)
   input electric power: 100 W After growing (depositing) the material layer to 300 nm, growth was halted and an oxygen treatment was conducted. The oxygen treatment was such that the material layer was placed in a pure oxygen atmosphere of 50 Pa at 500° C. for 5 hours.

After conducting the oxygen treatment, the substrate temperature was raised to 700° C., and 300 nm of PCMO was further deposited thereon.

After the deposition, the same oxygen treatment was conducted again while cooling the substrate to room temperature. In other words, in Comparative Example 2, the material layer formation step and the oxygen treatment step were conducted two times each.

As Comparative Example 3 (Conventional Example C), a variable-resistance element was fabricated using $Pr_{0.7}Ca_{0.3}MnO_3$ (hereunder referred to as "PCMO") as the material layer 12. In Comparative Example 3, the variable-resistance element was obtained in the same manner as in Comparative Example 2 except that the oxygen treatment was not conducted.

The material layers 12 formed in Example 1 and Comparative Examples 1-3 were subjected to X-ray diffraction and the result showed that they were all polycrystal.

Figure 8:
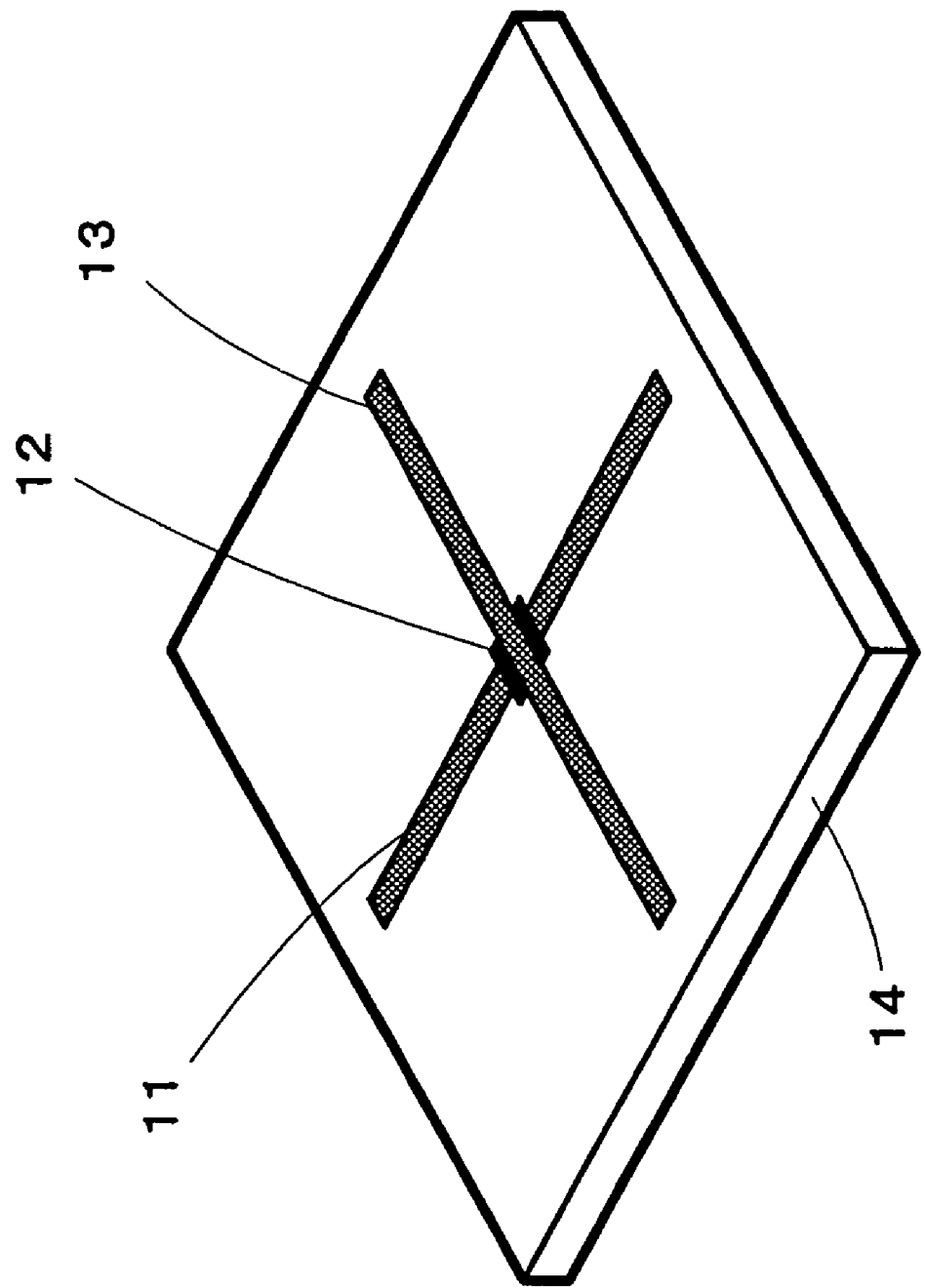
FIG. 8 shows an external view of the variable-resistance element of Example 1 and the memory element of Example 2.

FIG. 8 shows an external view of the variable-resistance element obtained in Example 1 and Comparative Examples 1-3. This external view was obtained by using a metal mask in the manner as described below.

A first metal mask having a rectangular opening (width of 0.5 mm and length of 10 mm) was positioned on the substrate 14. By depositing Pt on the metal mask, the first electrode 11 having a width of 0.5 mm and a length of 10 mm was formed on the substrate 14.

A second metal mask having a square opening (1 mm×1 mm) was prepared and positioned in such a manner that the center of the square opening was in line with the center of the rectangular first electrode 11. By depositing PCCO or PCMO on the metal mask, the material layer 12 was formed.

Thereafter, the first metal mask was positioned in such a manner that the center of its opening was in line with the center of the material layer 12 and the direction of the long side of the first electrode 11 was perpendicular to the direction of the long side of the opening of the metal mask. By depositing Ag on the metal mask, the second electrode 13 having a width of 0.5 mm and a length of 10 mm was formed.

In other words, in Example 1 and Comparative Examples 1-3, variable-resistance elements having a connecting area (i.e., the area in which the first electrode, the material layer and the second electrode overlap) of 0.5 mm×0.5 mm was fabricated.

In Example 1 and Comparative Examples 1-3, a Pt single film was used as the first electrode 11; however, the first electrode 11 is not limited to such a single film. A multilayer combining with other materials may also be used. For example, because Pt has poor adhesiveness to $SiO_2$ on the surface of the substrate, it is also possible to form the first electrode 11 as a multilayer by providing an adhesive layer of Ti, etc., between the Pt and the substrate to prevent peeling. Furthermore, other than the Ag used in Example 2 and Comparative Examples 1-3, Au, Pt, Cu, Al, ITO and like electrically conductive materials may be used singly or in combination for forming the second electrode 13.

<Confirmation of Memory Operation>

The memory operation of the variable-resistance elements obtained in Example 1 and Comparative Examples 1-3 (Conventional Examples A-C) was confirmed.

Specifically, by applying the SET voltage or RESET voltage as shown in FIG. 4, a variable-resistance element was written and the resistance of the variable-resistance element was measured by applying the READ voltage.

A pulsed voltage was applied across the first electrode 11 and the second electrode 13 using a pulse generator. The SET voltage was 5 V and the RESET voltage was −5 V, and both the SET voltage and the RESET voltage had a pulse duration of 250 ns. The READ voltage was 1 V and the pulse duration thereof was 250 ns.

The memory operation was evaluated based on the change in the resistance rate. Here, the change in the resistance rate (%) was obtained by the following formula with the maximum resistance and minimum resistance after application of the SET voltage and the RESET voltage being defined as $R_{max}$ and $R_{min}$ respectively.

Change in the resistance rate (%)=$(R_{max}-R_{min})/R_{min}$×100

Table 1 shows the change in the resistance rate of each variable-resistance element.

The variable-resistance elements comprising PCCO that were subjected to an oxygen treatment (sample numbers 1-1 to 1-9) exhibited a change in the resistance rate of 50% or greater. In contrast, the variable-resistance element in Conventional Example A (Comparative Example 1) comprising PCCO that had not undergone an oxygen treatment exhibited 5% or less change in the resistance rate. The variable-resistance elements of Conventional Example B (Comparative Example 2) and Conventional Example C (Comparative Example 3) exhibited almost the same amount of change in the resistance rate with or without having subjected PCMO to the oxygen treatment.

Thereafter, a heat resistance of each variable-resistance element in a reducing atmosphere was measured. Specifically, each variable-resistance element was heated from room temperature to 400° C. in an atmosphere to which a mixture of hydrogen and nitrogen (the amount of hydrogen was 5% of the total mixture gas) was introduced, and maintained at 400° C. for a half hour. The variable-resistance element was then cooled to room temperature, and the change in the resistance rate of each variable-resistance element was measured in the same manner as described above. Table 1 shows the change in the resistance rate of each variable-resistance element.

The variable-resistance elements of sample numbers 1-1 to 1-9 exhibited 10% or greater change in the resistance rate after being subjected to a heat treatment in a reducing atmosphere. In particular, in the range of $0.4 \leq x \leq 0.6$, a significant change in the resistance rate was maintained.

In contrast, the variable-resistance elements of Conventional Example A (Comparative Example 1) and Conventional Example B (Comparative Example 2) exhibited 5% or less change in the resistance rate after being subjected to a heat treatment in a reducing atmosphere, and their properties deteriorated so that a stable detection was difficult. Furthermore, writing or deleting operations at the SET voltage or RESET voltage also became unstable.

As described above, the variable-resistance element comprising PCCO that was subjected to an oxygen treatment is hardly affected even when oxygen desorption occurred in a reducing atmosphere. In contrast, PCMO was susceptible to the oxygen deficient in a reducing atmosphere even when the PCMO was subjected to an oxygen treatment, and its resistance law deteriorated remarkably.

TABLE 1

| Sample Number | x in $Pr_{1-x}Ca_xCoO_3$ | Oxygen treatment | Change in the resistance rate (%) | Change in the resistance rate (%) after heat treatment in a hydrogen atmosphere | Ratio of change in the resistance rate (%) before and after heat treatment in a hydrogen atmosphere |
|---|---|---|---|---|---|
| 1-1 | 0.1 | Conducted | 50 | 10 | 20.0 |
| 1-2 | 0.2 | Conducted | 100 | 10 | 10.0 |
| 1-3 | 0.3 | Conducted | 300 | 20 | 6.7 |
| 1-4 | 0.4 | Conducted | 1000 | 750 | 75.0 |
| 1-5 | 0.5 | Conducted | 1100 | 900 | 81.8 |
| 1-6 | 0.6 | Conducted | 800 | 500 | 62.5 |
| 1-7 | 0.7 | Conducted | 200 | 20 | 10.0 |
| 1-8 | 0.8 | Conducted | 100 | 10 | 10.0 |
| 1-9 | 0.9 | Conducted | 50 | 10 | 20.0 |
| Conventional Example A | 0.5 | Not conducted | <5 | <5 | — |
| Conventional Example B | $Pr_{0.7}Ca_{0.3}MnO_3$ | Conducted | 670 | <5 | — |
| Conventional Example C | $Pr_{0.7}Ca_{0.3}MnO_3$ | Not conducted | 680 | <5 | — |

<Overview>

PCCO, such as $RMCoO_3$ and PCMO are the same in that they have little oxygen nonstoichiometry but they are significantly different in their resistance to heat treatment conducted in a reducing atmosphere. Probably because PCMO exhibits a significant change in properties due to its oxygen nonstoichiometry in the same way as the Mn oxide with a perovskite structure disclosed in non-Patent Document 1, PCMO's resistance law abruptly changed following heat treatment in a reducing atmosphere. In contrast, although $RMCoO_3$ may exhibit little change in the absolute value of conductivity following heat treatment, its resistance law is well maintained.

The reason that PCCO exhibits very high heat treatment resistance in a reducing atmosphere in the range of ratio of chemical constituents of $0.4 \leq x \leq 0.6$ is unclear; however, the following reasons are conceivable:

Metal-insulator transition occurs in PCCO, especially under low temperatures around the ratio of $Pr_{0.5}Ca_{0.5}CoO_3$ chemical constituents with $0.4 \leq x \leq 0.6$, and it is believed that this property contributes to the development of heat treatment resistance.

Example 2 and Comparative Example 4
(Conventional Example D)

<Fabrication of the Memory Element (Variable-resistance Element)>

A memory element having the structure shown in FIG. 6 was fabricated. $Pr_{0.5}Ca_{0.5}CoO_3$ (referred to as PCCO in Example 2) was used as the material layer 12.

Figure 9:
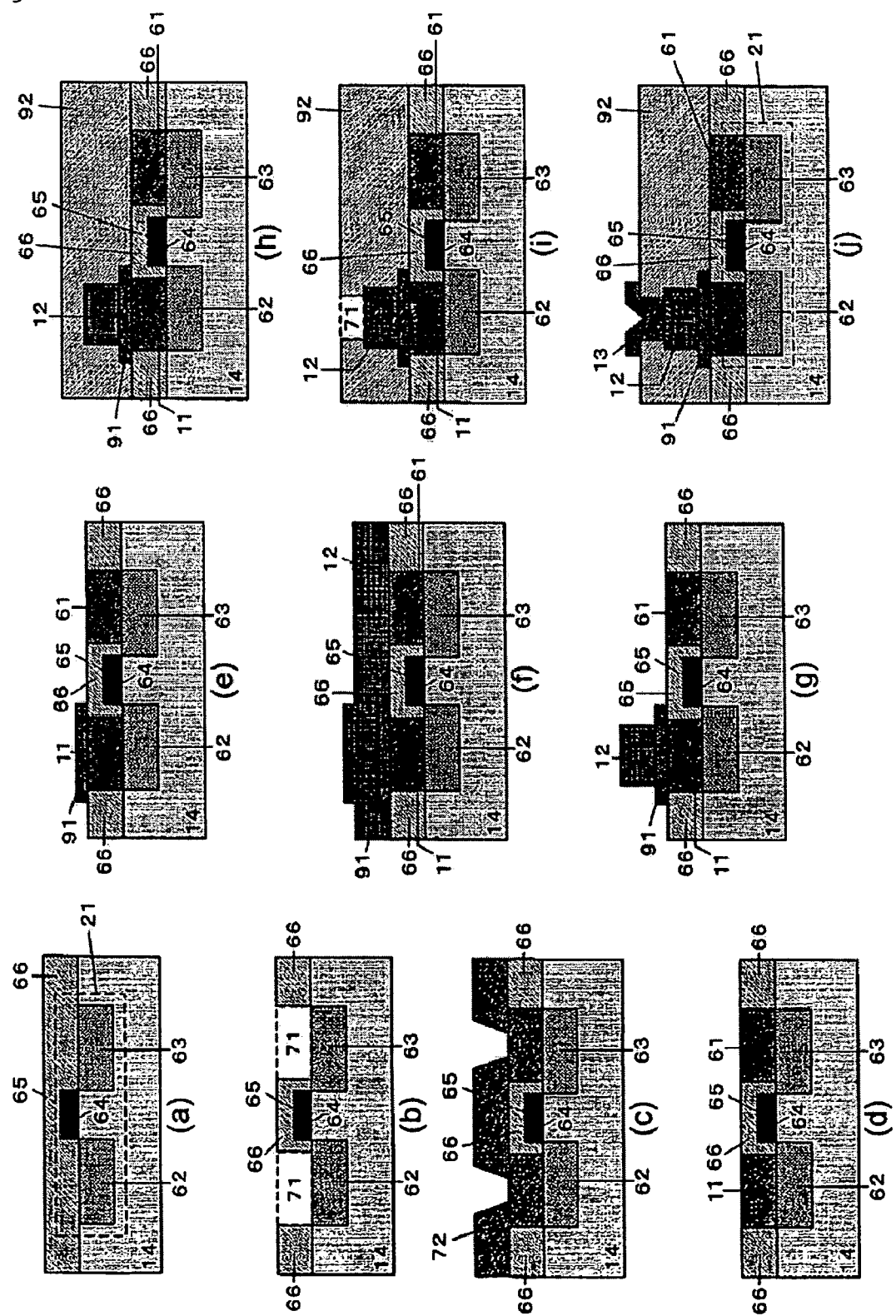
FIG. 9 shows steps of fabricating a memory element (variable-resistance element).

FIG. 9 shows the process for fabricating the memory element. The process for fabricating the memory element is explained below with reference to FIG. 9.

A substrate 14 comprising a MOS transistor 21 and an Si (100) surface was prepared.

An insulated oxide film 66 was deposited on the substrate 14 by sputtering (FIG. 9(a)).

A contact hole 71 was then formed in the insulated oxide film 66 by photolithography and ion milling (FIG. 9(b)).

Subsequently, an Ir layer 72 having a thickness of 600 nm was formed by sputtering (FIG. 9(c)), and the surface of the Ir layer 72 was subjected to CMP treatment, obtaining an embedded-type first electrode 11 and a contact electrode 61 as shown in FIG. 9(d). Thereafter, a 200-nm-thick extraction electrode 91 composed of Ir was formed by sputtering. Through the above-described steps, a lower electrode having a diameter of 0.8 μm was formed in a location that was not immediately above the transistor (FIG. 9(e)).

The material layer 12 (PCCO) was then formed. The material layer 12 was formed by magnetron sputtering under the following conditions (FIG. 9(f)).

substrate temperature: 650° C.,
    gas-pressure at the time of growth (deposition): 3 Pa,
    atmosphere: a mixture of oxygen and argon (the oxyecoia partial pressure was 20% of the total pressure)
    input electric power: 100 W After growing (depositing) the material layer to 100 nm, growth was halted and an oxygen treatment was conducted. The oxygen treatment was conducted by placing the material layer in a pure oxygen atmosphere of 50 Pa at 500° C. for 5 hours.

After conducting the oxygen treatment, the substrate temperature was raised to 650° C., and 100 nm of PCCO was further deposited thereon.

After the deposition, the same oxygen treatment was conducted while cooling the substrate to room temperature. By repeating the deposition and oxygen treatment steps, a PCCO thin film (12 in FIG. 9(f)) having a total thickness of 400 nm was obtained.

The PCCO thin film was processed to have a diameter of 0.5 μm by photolithography and ion milling (12 in FIG. 9(g)).

Thereafter, positive resist was applied to the PCCO thin film by using a spin coater, and the PCCO thin film was baked at 120° C. for 30 minutes, obtaining an interlayer insulating layer 92 (FIG. 9(h)).

A contact hole 71 having a diameter of 0.35 μm was formed in the material layer 12 (PCCO) by photolithography (FIG. 9(i)).

A second electrode 13 having a thickness of 300 nm was formed by depositing Pt on the contact hole 71 (FIG. 9(j)). The second electrode was formed by a magnetron sputtering method. Magnetron sputtering was conducted in an argon atmosphere of 0.7 Pa.

The reason for forming the material layer 12 (PCCO) in a location that is not immediately above the transistor by providing an extraction electrode 91 in Example 2 is as follows:

To obtain a highly crystalline material layer 12 (PCCO), a flat surface is more suitable than a location immediately above a transistor, where many irregularities are easily formed because the location undergoes many fabrication steps. However, in the case of a device that requires a high degree of integration, the structure is not limited to this and there is a possibility that a structure in which the material layer 12 is disposed immediately above a transistor can be employed.

The memory element fabricated in Example 2 corresponds to the diagram shown in FIG. 2. Such a memory element is provided with a bit line connected to a second electrode 13 and a word line connected to a gate electrode 65, and functions as a memory, i.e., performs writing, deleting, and reading operations by controlling the bit line and the word line.

Figure 10:
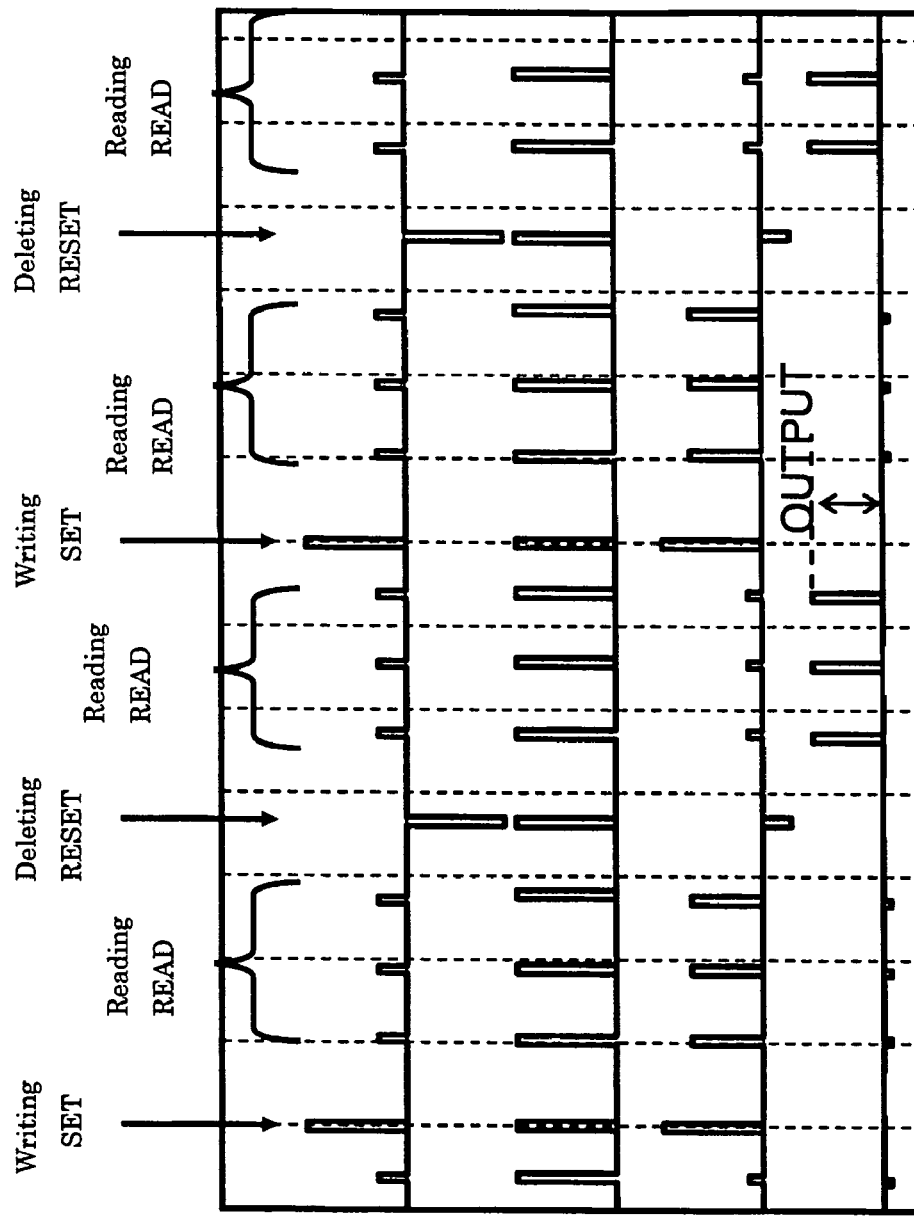
FIG. 10 shows the memory operation of a memory element (variable-resistance element).

In Example 2, the output obtained from writing or deleting by applying a voltage to a word line was detected, and the differential output between that and the output of a comparative variable-resistance element was detected and determined to be a read signal. The transistor was tuned ON in accordance with the timing of writing, deleting, or reading. FIG. 10 is a timing chart showing the operation of the memory element.

The memory element fabricated in Example 2 can serve as a random access-type memory element by being arranged in an array as shown in FIG. 3.

A memory element of Comparative Example 4 (Conventional Example D) was fabricated for comparison with the memory element of Example 2. The memory element of Comparative Example 4 was fabricated in the same manner as in Example 2 except that PCMO was used as the material layer 12.

<Confirmation of Memory Operation>

The heat treatment resistance in a reducing atmosphere of the memory elements of Example 2 and Comparative Example 4 (Conventional Example D) was evaluated in terms of memory operation.

Specifically, each variable-resistance element was heated from room temperature to 400° C. in an atmosphere to which a mixture of hydrogen and nitrogen (the amount of hydrogen was 5% of the total mixture gas) was introduced, and maintained at 400° C. for a half hour. Each variable-resistance element was cooled to room temperature, and its memory operation was then confirmed.

The memory operation was confirmed by detecting the output obtained from writing or deleting by applying a voltage to the word line. Specifically, the SET or RESET voltage as shown in FIG. 10 was applied while operating a MOS transistor, the read operation was conducted by applying the READ voltage, and the memory operation was confirmed based on the change in electric current.

The resistance law and memory operation were not observed in the memory element of Comparative Example 4 (Conventional Example D). The resistance law and memory operation were confirmed in the memory element of Example 2, and therefore it was confirmed that the memory element is capable of withstanding a high-temperature thermal process.

When the temperature of the heat treatment in a reducing atmosphere was changed to 700° C., no memory operation was confirmed in the memory element of Example 2 nor in the memory element of Comparative Example 4 (Conventional Example D).

Example 3 (Sample Numbers 3-1 to 3-8)

<Fabrication of Variable-resistance Element>

Eight types of variable-resistance elements were fabricated by the process described below.

A substrate 14 having an Si (100) surface was prepared.

A first electrode 11 (Pt) having a thickness of 400 nm was formed on the substrate 14 by a magnetron sputtering method. In Example 3, the first electrode 11 was a single layer of Pt; however, the first electrode 11 may be a multilayer as described above. The magnetron sputtering conditions were as follows:

substrate temperature: room temperature
gas-pressure at the time of growth (deposition): 0.7 Pa
atmosphere: only argon
input electric power: 80 W A material layer 12 as below was formed on the first electrode 11.

sample numbers 3-1: $La_{0.5}Ca_{0.5}CoO_3$ (hereafter referred to as LCCO)
sample numbers 3-2: $La_{0.5}Sr_{0.5}CoO_3$ (hereafter referred to as LSCO)
sample numbers 3-3: $La_{0.5}Ba_{0.5}CoO_3$ (hereafter referred to as LBCO)

The magnetron sputtering conditions for forming the material layer 12 were as follows.

substrate temperature: 700° C.
gas-pressure at the time of growth (deposition): 3 Pa
atmosphere: a mixture of oxygen and argon (the oxyecoia partial pressure was 20% of total pressure)
input electric power: 100 W A material layer 12 was formed, placed in a pure oxygen atmosphere of 100 Pa at 500° C. for 5 hours, and subjected to an oxygen treatment, obtaining an oxygen-treated 600-nm-thick material layer 12. The material layers 12 (LCCO, LSCO and LBCO) were subjected to X-ray diffraction and the result showed that they were all polycrystal.

A second electrode 13 (Ag) having a thickness of 1000 nm was formed using a metal mask with an opening having a diameter of 0.5 mm. The second electrode 13 was formed by magnetron sputtering under the following conditions.

substrate temperature: room temperature
gas-pressure at the time of growth (deposition): 0.7 Pa
atmosphere: only argon
input electric power: 80 W Variable-resistance elements of sample numbers 3-1 to 3-3 were fabricated by the above process.

The following variable-resistance elements were fabricated using the substances indicated below instead of the material layer 12. Other conditions were the same as above.

Sample number 3-4: $Nd_{0.5}Ca_{0.5}CoO_3$
Sample number 3-5: $Nd_{0.5}Sr_{0.5}CoO_3$
Sample number 3-6: $Nd_{0.5}Ba_{0.5}CoO_3$ The following variable-resistance elements were then fabricated using substances in which the Ca of LCCO and Sr of LSCO were partially replaced with Ba as a material layer. Other conditions were the same as above.

Sample number 3-7: $La_{0.5}Ca_{0.4}Ba_{0.1}CoO_3$
Sample number 3-8: $La_{0.5}Sr_{0.4}Ba_{0.1}CoO_3$ <Confirmation of Memory Operation>

The heat resistance of the eight types of variable-resistance elements fabricated in Example 3 was evaluated in the same manner as in Example 1, i.e., each variable-resistance element was heated from room temperature to 400° C. in an atmosphere to which a mixture of hydrogen and nitrogen (the amount of hydrogen was 5% of the total mixture gas) was introduced, and maintained at 400° C. for a half hour. Table 2 shows the change in the resistance rate. All the variable-resistance elements fabricated in Example 3 (sample numbers 3-1 to 3-8) exhibited excellent properties after the heat treatment. Among those, sample 3-8 exhibited a stable resistance law before and after the heat treatment.

TABLE 2

| Sample Number | Material layer 12 | Oxygen treatment | Change in the resistance rate (%) | Change in the resistance rate (%) after heat treatment in a hydrogen atmosphere | Ratio of change in the resistance rate (%) before and after heat treatment in a hydrogen atmosphere |
|---|---|---|---|---|---|
| 3-1 | $La_{0.5}Ca_{0.5}CoO_3$ | Conducted | 800 | 700 | 87.5 |
| 3-2 | $La_{0.5}Sr_{0.5}CoO_3$ | Conducted | 980 | 800 | 81.6 |
| 3-3 | $La_{0.5}Ba_{0.5}CoO_3$ | Conducted | 300 | 200 | 66.7 |
| 3-4 | $Nd_{0.5}Ca_{0.5}CoO_3$ | Conducted | 850 | 750 | 88.2 |
| 3-5 | $Nd_{0.5}Sr_{0.5}CoO_3$ | Conducted | 840 | 600 | 71.4 |
| 3-6 | $Nd_{0.5}Ba_{0.5}CoO_3$ | Conducted | 410 | 260 | 63.4 |
| 3-7 | $La_{0.5}Ca_{0.4}Ba_{0.1}CoO_3$ | Conducted | 900 | 820 | 91.1 |
| 3-8 | $La_{0.5}Sr_{0.4}Ba_{0.1}CoO_3$ | Conducted | 1100 | 970 | 88.2 |

INDUSTRIAL APPLICABILITY

A variable-resistance element of the present invention comprises a meterial layer that comprises an oxide semiconductor having a perovskite structure whose material layer is represented by $RMCoO_3$.

The material layer exhibits the same or better resistance law than conventional PCMO material layers by being subjected to heat treatment in an oxygen atmosphere. Having been subjected to the oxygen treatment, the material layer satisfactorily maintains the capacity for resistance variation even when heat treatment in a reducing atmosphere is conducted in a later step.

A variable-resistance element of the present invention is applicable to a non-volatile memory. For example, by combining a variable-resistance element of the present invention with a transistor, a non-volatile memory can be obtained. A variable-resistance element of the present invention can also be suitably used as a logic circuit, and as a sensor for detecting light, heat, stress, magnetism, etc. Furthermore, a variable-resistance element of the present invention can be used in electronic equipment having a random access memory function, such as an image display device.

The invention claimed is:

1. A method for fabricating a variable-resistance element provided with a material layer and first and second electrodes electrically connected to the material layer, the resistance of the material layer being variable in accordance with an electric current or voltage applied across the first and second electrodes, the method comprising:
   (1) a first electrode production step;
   (2) a step of forming the material layer on the first electrode, wherein the material layer comprises an oxide semiconductor having a perovskite structure represented by the chemical formula $RMCoO_3$, wherein R is a rare-earth element and M is an alkaline-earth element;
   (3) an oxygen treatment step of heating the material layer in an oxygen atmosphere;
   (4) a step of forming the second electrode on the material layer that was subjected to the oxygen treatment step; and
   (5) a hydrogen treatment step of heating the material layer, which was subjected to the step of forming the second electrode, in a reducing atmosphere containing hydrogen.

2. A fabrication method according to claim 1, wherein the oxide semiconductor having a perovskite structure is represented by the chemical composition formula $Pr_{1-x}Ca_xCoO_3$, wherein $0.4 \leq x \leq 0.6$.

3. A fabrication method according to claim 1, wherein the step of forming the material layer and the oxygen treatment step are repeated.

4. A fabrication method according to claim 1, wherein the oxygen treatment step is a step of heating the material layer in an atmosphere containing at least one member selected from the group consisting of molecular oxygen ($O_2$), ozone ($O_3$), and atomic oxygen (O).

5. A fabrication method according to claim 1, wherein the oxygen treatment step is a step of heating the material layer at 100 to 800° C.

6. A fabrication method according to claim 1, wherein the oxygen treatment step is a step of heating the material layer for 30 minutes to 12 hours.

* * * * *